United States Patent [19]

Yamamoto et al.

[11] 4,426,686
[45] Jan. 17, 1984

[54] READ-ONLY MEMORY DEVICE

[75] Inventors: Tsuyoshi Yamamoto, Sapporo; Hitoshi Takahashi, Yokohama, both of Japan

[73] Assignee: Fujitsu Limited, Kawasaki, Japan

[21] Appl. No.: 261,964

[22] Filed: May 8, 1981

[30] Foreign Application Priority Data

May 8, 1980 [JP] Japan ................................. 55-61030

[51] Int. Cl.$^3$ ............................................. G11C 11/40
[52] U.S. Cl. ....................................... 365/104; 365/94
[58] Field of Search ................................. 365/94, 104

[56] References Cited

U.S. PATENT DOCUMENTS

| | | | |
|---|---|---|---|
| 3,609,708 | 9/1971 | Cragon et al. | 365/94 |
| 4,084,105 | 4/1978 | Teranishi et al. | 365/104 |
| 4,144,587 | 3/1979 | Miyakawa et al. | 365/94 |

OTHER PUBLICATIONS

Williams et al., "Read-Only Storage Data Inversion for Speed Enhancement", IBM Tech. Disc. Bul., vol. 22, No. 8B, 1/80, pp. 3793–3794.
Jordan et al., "Read-Only Memory", IBM Tech. Disc. Bul., vol. 14, No. 7, 12/71, 526590066, pp. 2132–2135.

*Primary Examiner*—Stuart N. Hecker
*Attorney, Agent, or Firm*—Staas & Halsey

[57] ABSTRACT

A read-only memory device in which the presence or absence of a MOS transistor in a memory cell located at each intersection between word lines and bit lines is disclosed. In this device, when data belonging to one word line is written into the memory cells, the original data or the inverted data of the original data is written. The determination whether or not the data is inverted is performed in accordance with the number of data "0" or "1" belonging to each word line.

15 Claims, 5 Drawing Figures

READ-ONLY MEMORY DEVICE

BACKGROUND OF THE INVENTION

The present invention relates to a read-only memory (ROM) device and, more particularly, to a read-only memory device in which the data "0" or "1" corresponds to the presence or absence of a metal insulator semiconductor MIS transistor in a memory cell.

In a read-only memory device, which is a kind of random-access memory device, programming of the data pattern is fixed during manufacture and in addition, the data pattern can not be changed during operation. Therefore, the data pattern must be determined prior to the manufacture of such a read-only memory device.

According to one conventional read-only device of a MOS (broadly, MIS) transistor type, a gate mask is prepared for the above-mentioned data pattern so as to form enhancement type MOS transistors alternatively within memory cells located at intersections of word lines and bit lines. For example, in a memory cell, the data "0" corresponds to the absence of a MOS transistor, while the data "1" corresponds to the presence of a MOS transistor. In more detail, a gate oxide layer at the intersection corresponding to the data "0" is relatively thick so as to increase the threshold voltage thereof, which means that no transistor is substantially formed. Contrary to the above, a gate oxide layer at an intersection corresponding to the data "1" is relatively thin so as to decrease the threshold voltage thereof, which means that a MOS transistor is formed.

However, in the above-mentioned conventional device, such a phenomenon that a large number of MOS transistors are connected to one word line occurs. For example, when all the data belonging to one word line is "1", the number of MOS transistors connected to the word line reaches the maximum, which increases the capacitance of the word line due to the presence of a large number of thin gate oxide layers. As a result, the rising or falling of the potential of the word line corresponding to a change from the selected mode to the non-selected mode or vice versa becomes the slowest. That is, the access time for such a word line becomes the longest.

SUMMARY OF THE INVENTION

It is a principal object of the present invention to provide a read-only memory device with a small access time.

According to the present invention, there is provided a read-only memory device including first and second power supplies, a plurality of word lines and a plurality of bit lines intersecting the word lines and connected to the first power supply. The read-only memory device also includes a plurality of memory cells, each connected to one of the word lines and to one of the bit lines, wherein binary data or the inverted data of the binary data is written in accordance with the number of first data "0" belonging to each word line; and a plurality of means for storing either the binary data or the inverted data of the binary data written in said memory cells belonging to each of the word lines.

The present invention will be more clearly understood from the description as set forth below contrasting the present invention with the conventional device and with reference to the accompanying drawings.

DESCRIPTION OF THE PREFERRED EMBODIMENT

Figure 1:
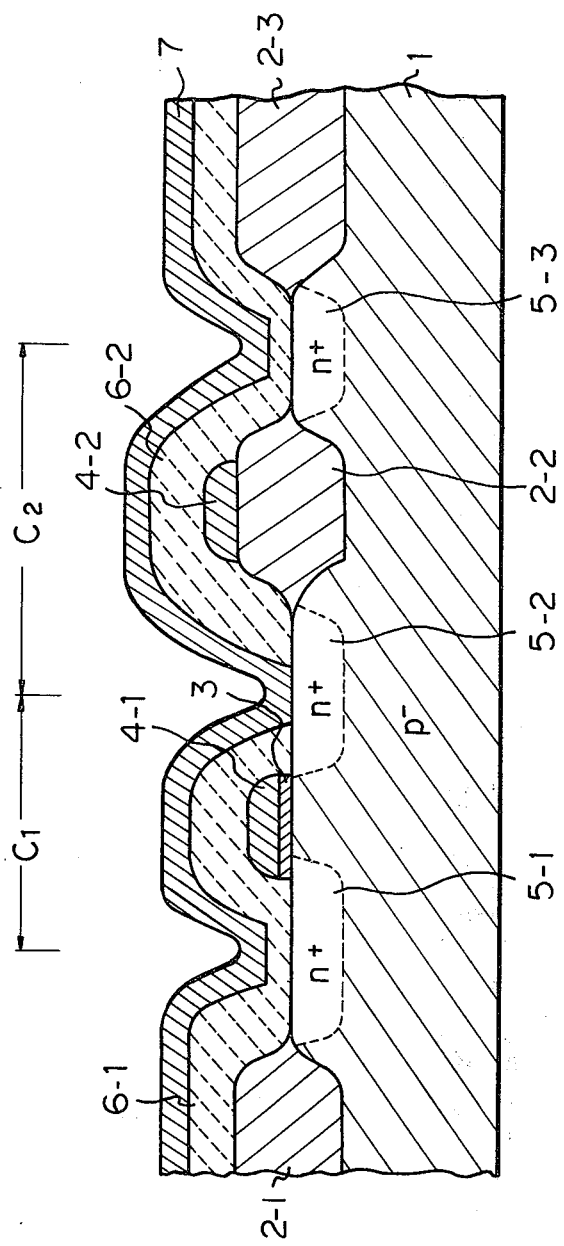
FIG. 1 is a cross-sectional view illustrating two memory cells of a conventional read-only memory device.

In FIG. 1, which illustrates two memory cells of a conventional read-only memory device, a memory cell $C_1$ comprises a MOS transistor, while a memory cell $C_2$ comprises no MOS transistor. That is, the memory cells $C_1$ and $C_2$ store the data "1" and "0", respectively. The device of FIG. 1 is manufactured by the following steps. First, a p-type silicon (Si) substrate 1 is prepared. Next, thick oxide ($SiO_2$) layers 2-1, 2-2 and 2-3 are formed on the substrate 1. After that, a thin gate oxide ($SiO_2$) layer 3 is formed and, in addition, electrically conductive layers 4-1 and 4-2 which are made of, for example, polycrystalline silicon are formed. Here, it should be noted that the conductive layers 4-1 and 4-2 serve as first and second word lines for the cells $C_1$ and $C_2$, respectively.

Next, $n^+$-type impurity regions 5-1, 5-2 and 5-3 are formed in the substrate 1 between the layers 2-1, 2-2, 2-3 and 3. After that, insulating layers 6-1 and 6-2 which are made of silicon oxide ($SiO_2$) or phosphosilicate glass (PSG) are formed and, in addition, an electrically conductive layer 7 which is made of, for example, aluminum, is formed. Here, it should be noted that the layer 7 serves as a bit line for the cell $C_1$ and $C_2$, respectively.

In the memory cell $C_1$, a MOS transistor is formed by the conductive layer 4-1, the thin oxide layer 3 and the impurity regions 5-1 and 5-2. In this case, the oxide layer 3 is so thin that it maintains the threshold voltage of the transistor at a relatively small positive level. Contrary to this, in the memory cell $C_2$, a MOS transistor is also formed by the conductive layer 4-2, the thick oxide layer 2-2 and the impurity regions 5-2 and 5-3. However, in this case, the layer 2-2 is so thick that it maintains the threshold voltage of the transistor at a considerably high level. This means that no MOS transistor is formed. Thus, the presence of a MOS transistor in the cell $C_1$ represents the data "1", while the absence of a MOS transistor in the cell $C_2$ represents the data "0".

Figure 2:
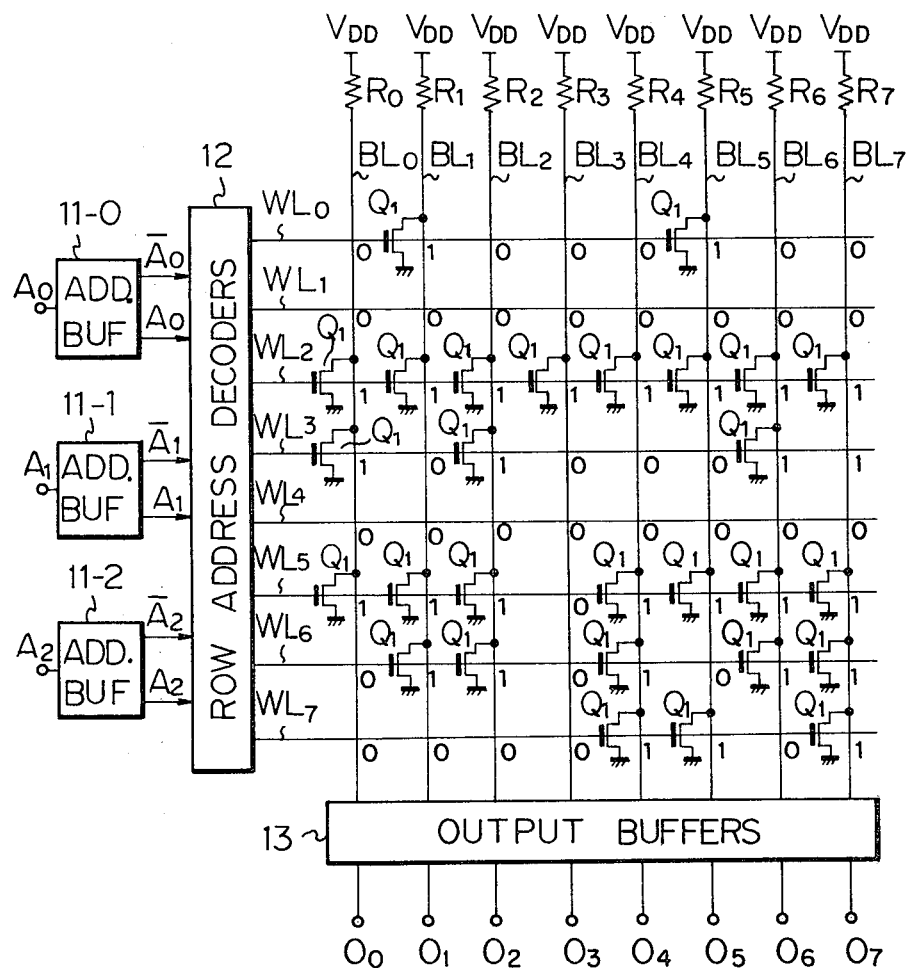
FIG. 2 is a circuit diagram illustrating a conventional read-only memory device.

FIG. 2 is a circuit diagram illustrating one conventional read-only memory device, which is, for example, a 64 (8 rows, 8 columns) bit device. In FIG. 2, the device comprises row address buffers 11-0, 11-1 and 11-2 for converting address signals $A_0$, $A_1$ and $A_2$ of a TTL level into address signals $A_0$, $A_1$ and $A_2$ of a MOS level and their inverted signals $\overline{A_0}$, $\overline{A_1}$ and $\overline{A_2}$, and row address decoders 12 for decoding the address signals $A_0$, $\overline{A_0}$, $A_1$, $\overline{A_1}$, $A_2$ and $\overline{A_2}$ so as to select one from the eight word lines $WL_0$, $WL_1$, ..., $WL_7$. The word lines $WL_0$, $WL_1$, ..., $WL_7$ intersect eight bit lines $BL_0$, $BL_1$, ..., $BL_7$ which are connected to a power supply $V_{DD}$ through loads $R_0$, $R_1$, ..., $R_7$, respectively. In addition, the bit lines $BL_0$, $BL_1$, ... $BL_7$ are connected through output buffers 13 to output terminals $O_0$, $O_1$, ..., $O_7$, respectively.

In FIG. 2, a memory cell exists at each intersection between the word lines $WL_0, WL_1, \ldots, WL_7$ and the bit lines $BL_0, BL_1, \ldots, BL_7$. In this case, the presence of a MOS transistor $Q_1$ in a memory cell represents the data "1", while the absence of a MOS transistor in a memory cell represents the data "0". In this case, the MOS transistor $Q_1$ has a gate which includes a parasitic capacitance connected to one of the word lines $WL_0, WL_1, \ldots, WL_7$, a drain connected to one of the bit lines $BL_0, BL_1, \ldots, BL_7$ and a source connected to the ground. The capacitance (parasitic) of each of the word lines $WL_0, WL_1, \ldots, WL_7$ is dependent upon the number of MOS transistors connected thereto, since each MOS transistor $Q_1$ has a thin gate oxide layer 3 (FIG. 1). In other words, the capacitance of each of the word lines $WL_0, WL_1, \ldots, WL_7$ is dependent upon the number of the data "1" belonging thereto. Therefore, in FIG. 2, the capacitance of the word line $WL_1$, in which the number of the data "1" is zero, is the minimum, while the capacitance of the word line $WL_2$, in which the number of the data "1" is eight, is the maximum. As a result, the rising or falling of the potential of the word line $WL_2$ corresponding to a change from the selected mode to the non-selected mode or vice versa becomes the longest. That is, the access time for the word line $WL_2$ becomes the longest, which is disadvantageous for the high-speed operation.

Figure 3:
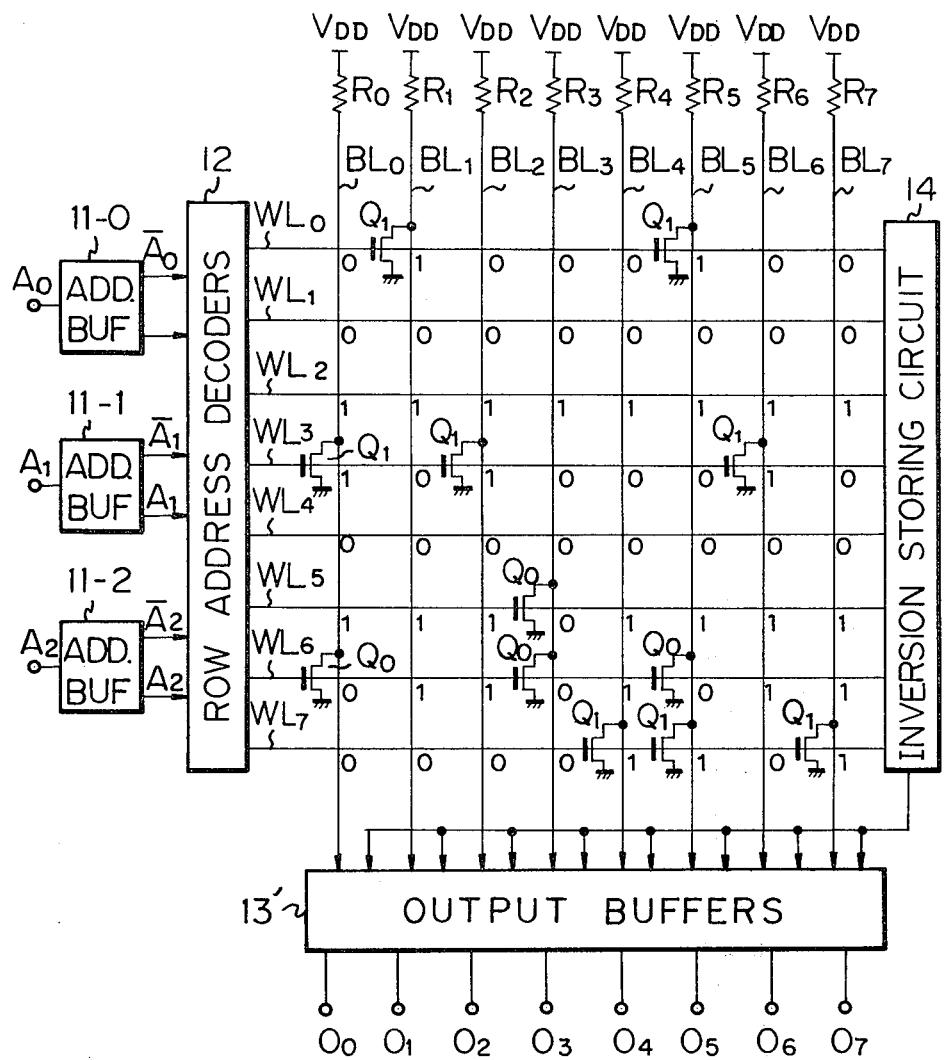
FIG. 3 is a circuit diagram illustrating an embodiment of the read-only memory device according to the present invention.

FIG. 3 is a circuit diagram illustrating an embodiment of the read-only memory device according to the present invention. In FIG. 3, the elements which are the same as those of FIG. 2 are denoted by the same references. In FIG. 3, the presence of a MOS transistor $Q_1$ in a memory cell represents the data "1", while the presence of a MOS transistor $Q_0$, which is the same type as the MOS transistor $Q_1$, represents the data "0". That is, in the word lines $WL_0, WL_1, WL_3, WL_4$ and $WL_7$, the presence and absence of a MOS transistor $Q_1$ in a memory cell represent the data "1" and "0", respectively. On the other hand, in the word lines $WL_2, WL_5$ and $WL_6$, the presence and absence of a MOS transistor $Q_0$ in a memory cell represent the data "0" and "1", respectively. In other words, the data with regard to the word lines $WL_2, WL_5$ and $WL_6$ is inverted with reference to the original data.

A determination whether or not the data is inverted is performed in accordance with the number of the data "0" or "1" belonging to each word line. For example, in the case where the number of the data "0" belonging to one word line is greater than or equal to five, the data is not inverted. This case corresponds to the word lines $WL_0, WL_1, WL_3, WL_4$ and $WL_7$. Contrary to this, in the case where the number of the data "0" belonging to one word line is smaller than or equal to four, the data is inverted. This case corresponds to the word lines $WL_2, WL_5$ and $WL_6$. As a result, the maximum number of MOS transistors connected to one word line is four, which is half of that of the conventional device of FIG. 1.

The above-mentioned determination whether or not the data which should be written with regard to one word line is inverted is indicated and stored by an inversion storing circuit 14. In addition, output buffers 13' include coincidence circuits which are shown not in FIG. 3, but shown in FIGS. 4 and 5. As a result, only the inverted data stored in the memory cells is again inverted in the output buffers 13' by using the coincidence circuits. Therefore, the data obtained at the output terminals $O_0, O_1, \ldots, O_7$ in FIG. 3 is the same as the data obtained at the output terminals $O_0, O_1, \ldots, O_7$ in FIG. 2.

Figure 4:
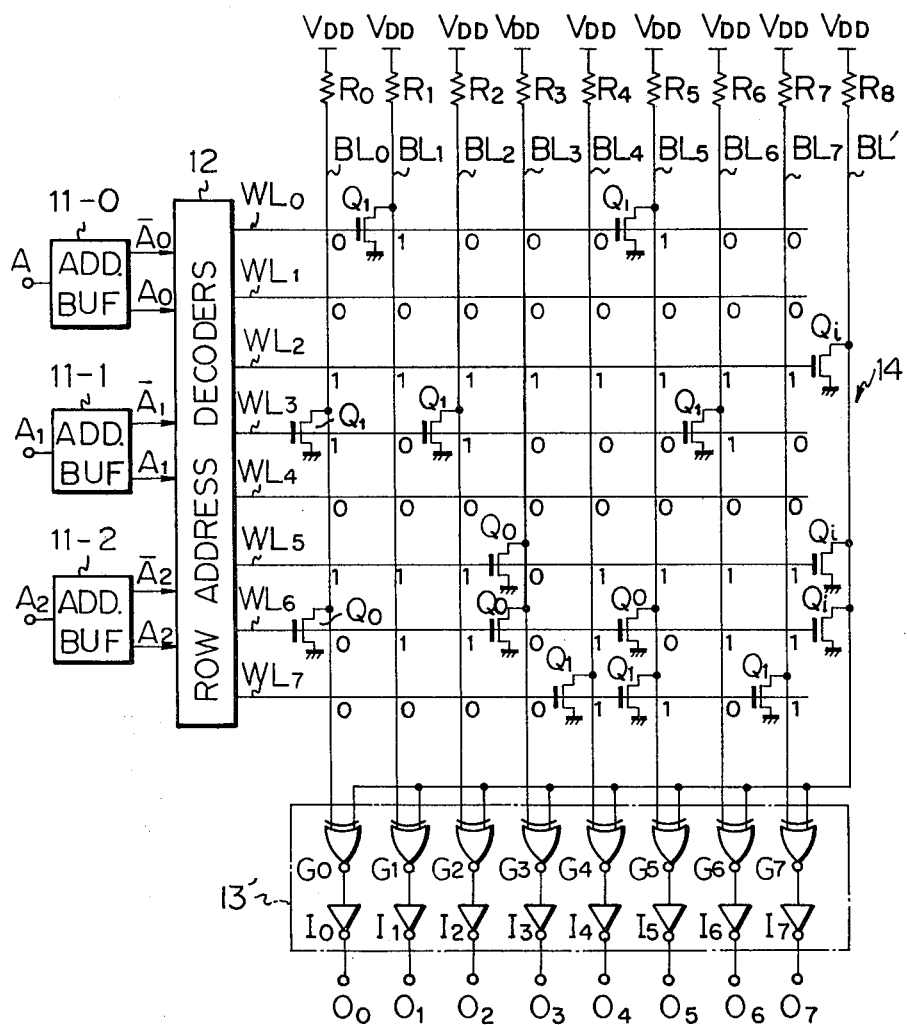
FIG. 4 is a detailed circuit diagram of the circuit of FIG. 3.

FIG. 4 is a detailed circuit diagram of the device of FIG. 3. In FIG. 4, an additional bit line BL' is provided. The inversion storing circuit 14 comprises a MOS transistor $Q_i$, which is also the same type as the MOS transistor $Q_1$, connected to each of the word lines $WL_2$, $WL_5$ and $WL_6$. That is, the presence or absence of a MOS transistor $Q_i$ at each intersection between the word lines $WL_0, WL_1, \ldots, WL_7$ and the additional bit line BL' represent the determination whether or not the data with regard to the word line is inverted. In addition, the output buffers 13' comprise exclusive NOR circuits $G_0, G_1, \ldots, G_7$ which serve as coincidence circuits. Each of the circuits $G_0, G_1, \ldots, G_7$ has an input connected to one of the bit lines $BL_0, BL_1, \ldots, BL_7$ and an input connected to the additional bit line BL'. The circuits $G_0, G_1, \ldots, G_7$ are connected to inverters $I_0, I_1, \ldots, I_7$, respectively; accordingly, the combination of one of the exclusive NOR circuits and one of the inverters forms an exclusive OR circuit.

The read operation will now be explained. If the word line $WL_0$ is selected by the high potential thereof, each transistor $Q_1$ at the intersections between the word line $WL_0$ and the bit lines $BL_1$ and $BL_5$ is turned on. As a result, the potentials of the bit lines $BL_1$ and $BL_5$ are low, while the potentials of the other bit lines remain high ($V_{DD}$). On the other hand, the potential of the additional bit line BL' also remains high, since no transistor is formed at the intersection of the word line $WL_0$ and the additional bit line BL'. Therefore, the potentials at the output terminals $O_0$ through $O_7$ are low, high, low, low, low, high, low and low, respectively, which means that the original data 01000100 is obtained at the output terminals $O_1, O_2, \ldots, O_7$.

Next, the word line $WL_5$ is selected by the high potential thereof, the transistor $Q_0$ at the intersection of the word line $WL_5$ and the bit line $BL_3$ is turned on. As a result, the potential of the bit line $BL_3$ is low, while the potentials of the other bit lines are high. In addition, the potential of the additional bit line BL' is low due to the conductance of the transistor $Q_i$ at the intersection of the word line $WL_5$ and the additional bit line BL'. Therefore, the potentials at the output terminals $O_0, O_1, \ldots, O_7$ are high, high, high, low, high, high, high and high, respectively, which means that the original data 11101111 is obtained at the output terminals. Thus, regardless of the data or the inverted data stored in the memory cells, the original data is restored at the output terminals $O_1, O_2, \ldots, O_7$.

Figure 5:
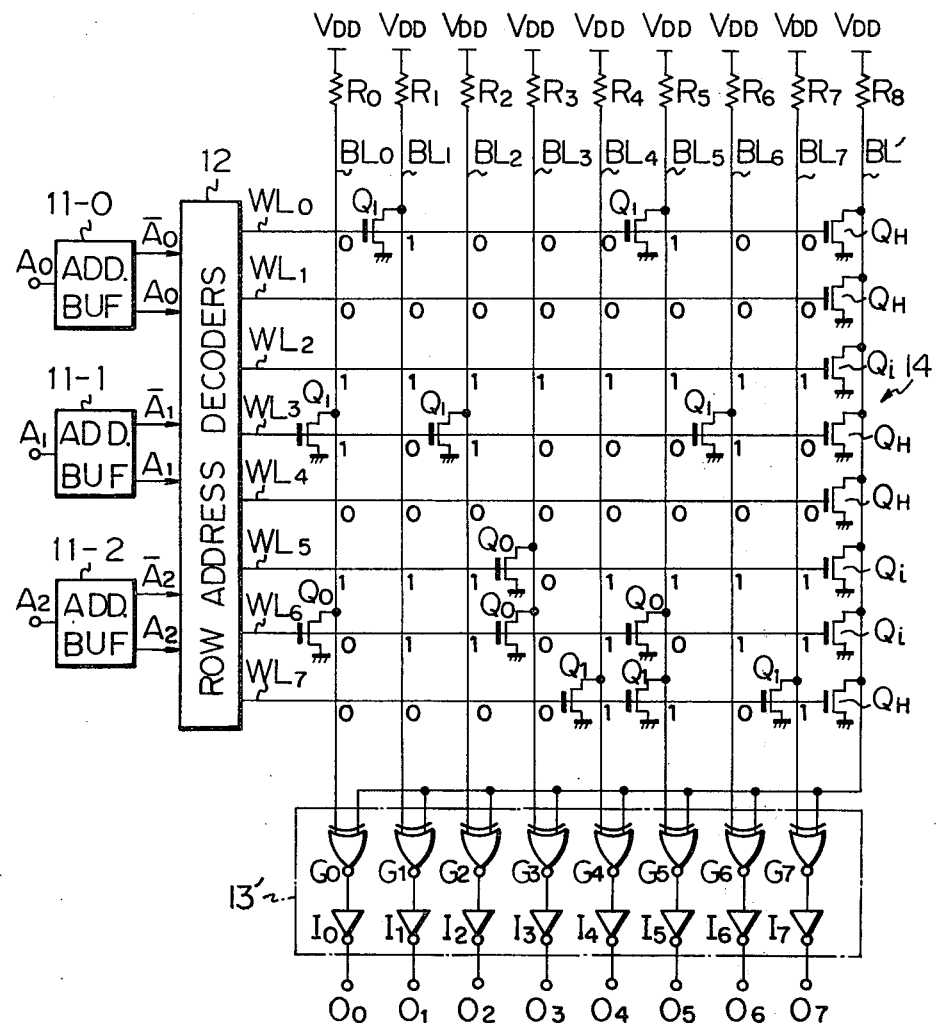
FIG. 5 is a modification of FIG. 4.

FIG. 5 is a modification of FIG. 4. That is, in FIG. 5, a MOS transistor having the thin gate oxide layer 3 of FIG. 1 is provided at each intersection of the word lines $WL_0, WL_1, \ldots, WL_7$ and the additional bit line BL'. However, the threshold voltage value of a MOS transistor $Q_H$ located in the word lines $WL_0, WL_1, WL_3, WL_4$ and $WL_7$ is considerably higher than the other MOS transistors such as $Q_1$, $Q_0$ and $Q_i$. This can be performed by changing a concentration of impurity of a channel of the MOS transistors, for example, by using ion-implantation technology. Therefore, although the transistor $Q_H$ has a thin oxide layer 3 of FIG. 1, the transistor $Q_H$ does not serve as a transistor, since the high potential of the word line does not cause the transistor $Q_H$ to be conductive and no transistor is formed. Therefore, the device of FIG. 5 is substantially the same as that of FIG. 4. However, all the data stored in the memory cells of the device of FIG. 4 can be easily observed from an outside view; the data stored in the memory cells of the device of FIG. 5 can not be easily observed from the outside view since the external views of transistors for storing whether or not the data is inverted are all the same.

In the above-mentioned embodiment, a 64-bit read-only memory device is illustrated; however, it should be noted that, such a read-only memory device is of a large scale which is, for example, 1024 or more bits, so that such an additional bit line does not affect the integration density of a read-only memory device.

As explained hereinbefore, the read-only memory device according to the present invention has an advantage, as compared with the conventional device, in that the access time is small, since the number of MOS transistors connected to one word line is reduced; and accordingly, the maximum capacitance of the word lines is reduced.

We claim:

1. A read-only memory device, for storing binary data having first and second levels, respectively, comprising:
   first and second power supplies;
   a plurality of word lines;
   a plurality of bit lines intersecting said word lines and connected to said first power supply;
   a plurality of memory cells, each operatively connected to one of said word lines, one of said bit lines and said second power supply, some of said memory cells comprise metal insulator semiconductor transistors, each having a gate operatively connected to one of said word lines, a drain operatively connected to one of said bit lines and a source operatively connected to said second power supply, said binary data or the inversion of said binary data is written in said memory cells in dependence upon the number of first levels in said binary data belonging to each word line and the presence or absence of a metal insulator semiconductor transistor in each memory cell represents either the first level or the second level respectively; and
   a plurality of inversion storing means, each operatively connected to a one of said word lines, for storing and indicating that either said binary data or the inversion of said binary data is written in said memory cells belonging to each of said word lines.

2. A device as set forth in claim 1, further comprising a plurality of coincidence circuits, each connected to one of said bit lines and to said inversion storing means.

3. A read-only memory device as set forth in claim 1, wherein the presence of a metal insulator semiconductor transistor in each memory cell operatively connected to one word line corresponds to the first level when the number of the first levels in said binary data belonging to the one of said word lines is smaller than a first value; and the presence of a metal insulator semiconductor transistor in each memory cell operatively connected to the one word line corresponds to the second level when the number of the first levels in said binary data belonging to the one of said word lines is not smaller than said first value.

4. A read-only memory device as set forth in claim 1, further comprising an additional bit line intersecting said word lines and operatively connected to said first power supply, and wherein some of said plurality of inversion storing means comprise metal insulator semiconductor transistors, each having a gate operatively connected to one of said word lines, a drain operatively connected to said additional bit line and a source operatively connected to said second power supply, the presence or absence of a metal insulator semiconductor transistor at the intersection of each word line and said additional bit line being determined in dependence upon the number of first levels in said binary data belonging to each word line.

5. A read-only memory device as set forth in claim 1, further comprising an additional bit line intersecting said word lines and operatively connected to said first power supply, and wherein each of said inversion storing means comprises a metal insulator semiconductor transistor having a gate operatively connected to one of said word lines, a drain operatively connected to said additional bit line, a source operatively connected to said second power supply, a threshold voltage value and a channel region, the threshold voltage value of said metal insulator semiconductor transistor at the intersection of each word line and said additional bit line being determined by changing a concentration of impurity of the channel region of said metal insulator semiconductor transistor in dependence upon the number of first levels in said binary data belonging to each word line.

6. A read only memory device as set forth in claim 1, further comprising decoder means, operatively connected to said word lines, for selecting a word line using a high potential, and wherein the gates of said metal insulator semiconductor transistors have parasitic capacitances which require charging up by the high potential during the selection operation.

7. A read-only memory device comprising:
   first bit lines;
   a second bit line;
   a word line having associated therewith binary data having first and second bits;
   memory cells, each operatively connected between said word line and one of said first bit lines, for storing binary data or the inversion of the binary data in dependence upon the number of first bits in the binary data associated with said word line and being driven by said word line;
   inversion indicating means, operatively connected between said word line and said second bit line, for indicating that the binary data associated with said word line is stored as the binary data or as the inversion of the binary data; and
   a coincidence circuit, operatively connected to said first bit lines and said second bit line, wherein the binary data is stored as the inversion of the binary data said coincidence circuit converts the inversion of the binary data into the binary data.

8. A read-only memory device as set forth in claim 7, wherein some of said memory cells comprise a transistor, the existence of said transistor being in dependence upon the number of first bits in the binary data and each existing said transistor having a gate operatively connected to said word line and being connected to one of said first bit lines.

9. A read only memory device as set forth in claim 8, further comprising decoder means, operatively connected to said word lines, for selecting a word line using a high potential, and wherein the gates of said transistors have parasitic capacitances which require charging up by the high potential during the selection operation.

10. A read-only memory device as set forth in claim 7, wherein said inversion indication means comprises a transistor, the existence of said transistor being in dependence upon the number of first bit in the binary data associated with said word line and each existing said transistor operatively connected between said word line and said second bit line.

11. A read-only memory device as set forth in claim 7, wherein said inversion indication means comprises a transistor, operatively connected between said word line and said second bit line, having a threshold which allows transistor operation in dependence upon the number of first bits in the binary data associated with said word line.

12. A read-only memory device, for storing binary data having first and second levels, respectively, comprising:

first and second power supplies;
a plurality of word lines;
a plurality of bit lines intersecting said word lines and connected to said first power supply;
a plurality of memory cells, each operatively connected to one of said word lines, one of said bit lines and said second power supply, some of said memory cells comprise metal insulator semicoductor transistors, each having a gate operatively connected to one of said word lines, a drain operatively connected to one of said bit lines and a source operatively connected to said second power supply, said binary data or the inversion of said binary data is written in said memory cells in dependence upon the number of first levels in said binary data belonging to each word line and the presence or absence of a metal insulator semiconductor transistor in each memory cell represents either the first level or the second level respectively;
an additional bit line intersecting said word lines and operatively connected to said first power supply; and
a plurality of inversion storing means, each operatively connected to a one of said word lines, for storing and indicating that either said binary data or the inversion of said binary data is written in said memory cells belonging to each of said word lines, some of said plurality of inversion storing means comprising metal insulator semiconductor transistors, each having a gate operatively connected to one of said word lines, a drain operatively connected to said additional bit line and a source operatively connected to said second power supply, the presence or absence of a metal insulator semiconductor transistor at the intersection of each word line and said additional bit line being determined in dependence upon the number of first levels in said binary data belonging to each word line.

13. A read-only memory device, for storing binary data having first and second levels, respectively, comprising:

first and second power supplies;
a plurality of word lines;
a plurality of bit lines intersecting said word lines and connected to said first power supply;
a plurality of memory cells, each operatively connected to one of said word lines, one of said bit lines and said second power supply, some of said memory cells comprise metal insulator semiconductor transistors, each having a gate operatively connected to one of said word lines, a drain operatively connected to one of said bit lines and a source operatively connected to said second power supply, said binary data or the inversion of said binary data is written in said memory cells in dependence upon the number of first levels in said binary data belonging to each word line and the presence or absence of a metal insulator semiconductor transistor in each memory cell represents either the first level or the second level respectively;
an additional bit line intersecting said word lines and operatively connected to said first power supply; and
a plurality of inversion storing means, each operatively connected to one of said word lines, for storing and indicating that either said binary data or the inversin of said binary data is written in said memory cells belonging to each of said word lines, each of said inversion storing means comprising a metal insulator semiconductor transistor having a gate operatively connected to one of said word lines, a drain operatively connected to said additional bit line, a source operatively connected to said second power supply, a threshold voltage value and a channel region, the threshold voltage value of said metal insulator semiconductor transistor at the intersection of each word line and said additional bit line being determined by changing a concentration of impurity of the channel region of said metal insulator semiconductor transistor in dependence upon the number of first levels in said binary data belonging to each word line.

14. A read-only memory device comprising:
first bit lines;
a second bit line;
a word line having associated therewith binary data having first and second bits;
memory cells, each operatively connected between said word line and one of said first bit lines, for storing binary data or the inversion of the binary data in dependence upon the number of first bits in the binary data associated with said word line and being driven by said word line;
inversion indication means, operatively connected between said word line and said second bit line, for indicating that the binary data associated with said word line is stored as the binary data or as the inversion of the binary data, said inversion indication means comprising a transistor, the existence of said transistor being in dependence upon the number of first bits in the binary data associated with said word line and each existing said transistor operatively connected between said word line and said second bit line; and
a coincidence circuit, operatively connected to said first bit lines and said second bit line, wherein when the binary data is stored as the invergion of the binary data said coincidence circuit converts the inversion of the binary data into the binary data.

15. A read-only memory device comprising:
first bit lines;
a second bit line;
a word line having associated therewith binary data having first and second bits;
memory cells, each operatively connected between said word line and one of said first bit lines, for storing binary data or the inversion of the binary data in dependence upon the number of first bits in the binary data associated with said word line and being driven by said word line;

inversion indication means, operatively connected between said word line and said second bit line, for indicating that the binary data associated with said word line is stored as the binary data or as the inversion of the binary data, said inversion indication means comprising a transistor, operatively connected between said word line and said second bit line, having a threshold which allows transistor operation in dependence upon the number of first bits in the binary data associated with said word line; and a coincidence circuit, operatively connected to said first bit lines and said second bit line, wherein when the binary data is stored as the inversion of the binary data said coincidence circuit converts the inversion of the binary data into the binary data.

* * * * *

UNITED STATES PATENT AND TRADEMARK OFFICE
CERTIFICATE OF CORRECTION

PATENT NO. : 4,426,686
DATED      : JANUARY 17, 1984
INVENTOR(S): TSUYOSHI YAMAMOTO ET AL.

It is certified that error appears in the above-identified patent and that said Letters Patent is hereby corrected as shown below:

Col. 2, line 59, "$A_0$, $A_1$ and $A_2$" should be

--$\bar{A}_0$, $\bar{A}_1$ and $\bar{A}_2$--;

line 61, "$A_0$, $A_1$, $A_1$, $A_2$ and $A_2$" should be

--$\bar{A}_0$, $A_1$, $\bar{A}_1$, $A_2$ and $\bar{A}_2$--.

Col. 6, line 44, "indicating" should be --indication--.

Col. 8, line 14, after "to" insert --a--;
line 16, "inversin" should be --inversion--;
line 57, "invergion" should be --inversion--.

Signed and Sealed this

Twenty-ninth Day of May 1984

[SEAL]

Attest:

GERALD J. MOSSINGHOFF

Attesting Officer

Commissioner of Patents and Trademarks